(12) United States Patent
Perzlmaier et al.

(10) Patent No.: US 12,514,042 B2
(45) Date of Patent: Dec. 30, 2025

(54) OPTOELECTRONIC SEMICONDUCTOR COMPONENT

(71) Applicant: OSRAM Opto Semiconductors GmbH, Regensburg (DE)

(72) Inventors: Korbinian Perzlmaier, Regensburg (DE); Tobias Meyer, Kelheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 974 days.

(21) Appl. No.: 17/603,602

(22) PCT Filed: Apr. 9, 2020

(86) PCT No.: PCT/EP2020/060191
§ 371 (c)(1),
(2) Date: Oct. 14, 2021

(87) PCT Pub. No.: WO2020/212252
PCT Pub. Date: Oct. 22, 2020

(65) Prior Publication Data
US 2022/0262999 A1 Aug. 18, 2022

(30) Foreign Application Priority Data
Apr. 17, 2019 (DE) ............ 10 2019 110 200.6

(51) Int. Cl.
*H10H 20/857* (2025.01)
*H10H 20/821* (2025.01)
(Continued)

(52) U.S. Cl.
CPC ........ *H10H 20/857* (2025.01); *H10H 20/821* (2025.01); *H10H 20/8312* (2025.01); *H10H 20/8314* (2025.01); *H10H 20/8506* (2025.01)

(58) Field of Classification Search
CPC ....... H01L 33/62; H01L 33/24; H01L 33/385; H01L 33/382; H01L 33/486;
(Continued)

(56) References Cited

U.S. PATENT DOCUMENTS

| 2009/0173961 A1 | 7/2009 | Windisch et al. |
| 2013/0207139 A1 | 8/2013 | Weidner et al. |
| 2016/0099383 A1 | 4/2016 | Yuh |

FOREIGN PATENT DOCUMENTS

| DE | 102006039369 A1 | 7/2007 |
| DE | 102007019775 A1 | 10/2008 |

(Continued)

OTHER PUBLICATIONS

Internation Search Report issued for the International application No. PCT/EP2020/060191, dated Jun. 19, 2020, 4 pages (for information purposes only).

(Continued)

*Primary Examiner* — Norman D Richards
(74) *Attorney, Agent, or Firm* — Viering, Jentschura & Partner mbB

(57) ABSTRACT

An optoelectronic semiconductor component may include a semiconductor body having a first semiconductor region of a first conductivity type and a second semiconductor region of a second conductivity type, as well as a first surface and a second surface different from the first surface. The component may further include a first contact structure for electrically contacting the first semiconductor region and a second contact structure for electrically contacting the second semiconductor region. The first and second contact structures may each have a first connection region arranged on the first surface and a second connection region arranged on the second surface for electrically contacting the semiconductor component from the outside. The first and second connection regions of the first contact structure and the first (Continued)

and second connection regions of the second contact structure may each be designed to be rotationally symmetrical with respect to an axis of symmetry.

16 Claims, 10 Drawing Sheets

(51) Int. Cl.
*H10H 20/831* (2025.01)
*H10H 20/85* (2025.01)

(58) Field of Classification Search
CPC ..... H01L 25/0753; H01L 33/20; H01L 33/38; H01L 33/44
See application file for complete search history.

(56) References Cited

FOREIGN PATENT DOCUMENTS

| EP | 3270413 A1 | 1/2018 |
| EP | 3410480 A2 | 12/2018 |
| KR | 20090010623 A | 1/2009 |

OTHER PUBLICATIONS

German Search Report issued for the corresponding German application No. 10 2019 110 200.6, dated Jun. 24, 2019, 8 pages (for information purposes only).

OPTOELECTRONIC SEMICONDUCTOR COMPONENT

CROSS-REFERENCE TO RELATED APPLICATIONS

The present application is a national stage entry according to 35 U.S.C. § 371 of PCT Application No. PCT/EP2020/060191 filed on Apr. 9, 2020; which claims priority to German Patent Application Serial No. 10 2019 110 200.6 filed on Apr. 17, 2019; all of which are incorporated herein by reference in their entirety and for all purposes.

TECHNICAL FIELD

The disclosure relates to an optoelectronic semiconductor component, in particular a radiation-emitting semiconductor component.

BACKGROUND

Radiation-emitting semiconductor components such as light-emitting diodes generate electromagnetic radiation when a suitable electric current flows through them. The light-emitting diodes have electrical connection regions for being supplied with electric current. In flip chips, the connection regions are arranged on a single side, while in so-called "n-up" or "p-up" chips they are located on opposite sides. When mounting these light-emitting diodes, care must be taken to ensure their correct orientation so that the connection regions of the light-emitting diodes can be contacted from the outside. Their correct orientation is associated with a comparatively high adjustment effort.

It is an object of the present disclosure to specify an optoelectronic semiconductor component which is comparatively easy to assemble.

SUMMARY

According to at least one embodiment, the optoelectronic semiconductor component comprises a semiconductor body comprising a first semiconductor region of a first conductivity type and a second semiconductor region of a second conductivity type as well as a first surface and a second surface different from the first surface. A second surface different from the first surface is to be understood in particular as a surface extending in a different plane than the first surface. For example, the second surface may be arranged at a distance parallel to the first surface or transverse thereto.

Furthermore, the optoelectronic semiconductor component comprises a first contact structure for electrically contacting the first semiconductor region and a second contact structure for electrically contacting the second semiconductor region. The first and second contact structures advantageously each comprise a first connection region arranged on the first surface and a second connection region arranged on the second surface for electrically contacting the semiconductor component from the outside. In order that the connection regions can be contacted from the outside, they are exposed or uncovered at least in places.

Furthermore, the first and second connection regions of the first contact structure and the first and second connection regions of the second contact structure are each advantageously designed to be rotationally symmetrical with respect to a symmetry axis, that is to say in particular rotationally symmetrical in relation to one another. Furthermore, the first and second connection regions of the first contact structure and the first and second connection regions of the second contact structure may each be designed to be mirror-symmetrical with respect to a symmetry plane, that is to say in particular mirror-symmetrical in relation to one another. In this context, a rotationally symmetrical or mirror-symmetrical design is to be understood not only as an identical design of the connection regions, but also as an equal design of the connection regions, that is to say having slight deviations in shape and/or size and/or position. The symmetry axis may be arranged parallel or transverse to a main extension plane of the semiconductor component and extends in particular through the semiconductor component, but not through the connection regions. Likewise, the symmetry plane is advantageously arranged parallel or transverse to a main extension plane of the semiconductor component and extends in particular through the semiconductor component.

The rotationally symmetrical design of the connection regions on two different surfaces, for example on a front side and a rear side of the optoelectronic semiconductor component, has the advantage that the optoelectronic semiconductor component can be mounted and electrically connected without reorienting the semiconductor component when the front side and the rear side are interchanged. This reduces the adjustment effort required.

According to at least one embodiment, the first and second connection regions of the first and second contact structures each have a rotationally symmetrical shape. In particular, the connection regions have a rotationally symmetrical shape with respect to a symmetry axis of the semiconductor body, the symmetry axis extending through the connection regions. In a non-limiting embodiment, the connection regions of the first contact structure are frame-shaped, for example ring-shaped. The connection regions of the second contact structure may also be frame-shaped, for example ring-shaped, or have the shape of a rectangle or circle.

According to at least one embodiment, the first connection region of the second contact structure is flanked by the first connection region of the first contact structure. Accordingly, the second connection region of the second contact structure may also be flanked by the second connection region of the first contact structure. In particular, this means that the respective connection region of the second contact structure is bounded on at least two sides by the corresponding connection region of the first contact structure.

In a non-limiting embodiment, the first connection region of the first contact structure surrounds the first connection region of the second contact structure and the second connection region of the first contact structure surrounds the second connection region of the second contact structure in a frame-like manner. In other words, the respective connection region of the first contact structure fully surrounds the corresponding connection region of the second contact structure, that is, on all sides. Thereby, the connection regions of the first contact structure each form an outer contact on the respective surface and the connection regions of the second contact structure each form an inner contact on the respective surface.

Furthermore, an intermediate space is present in particular between the first connection regions of the two contact structures, so that the first connection regions are electrically insulated from one another. This also applies accordingly to the second connection regions of the two contact structures.

In an advantageous embodiment of the optoelectronic semiconductor component, the first semiconductor region is a p-type semiconductor region. Furthermore, the second semiconductor region is in particular an n-type semiconductor region. The first and second semiconductor regions may each comprise a plurality of successive semiconductor layers.

The first and second semiconductor regions or the respective layers contained therein can be grown in layers one after the other on a growth substrate by means of an epitaxy process. Suitable materials for the growth substrate are, for example, sapphire, SiC and/or GaN. The growth substrate may remain in the semiconductor body or may be at least partially removed. In the latter case, the semiconductor layer sequence can be arranged on a replacement carrier.

According to at least one embodiment, the optoelectronic semiconductor component is a radiation-emitting component. Here, the semiconductor body comprises an active zone suitable for generating radiation. In particular, the active zone is a p-n junction zone. In this regard, the active zone may be formed as a layer or as a sequence of layers. For example, during operation of the semiconductor component, the active zone emits electromagnetic radiation, for example in the visible, ultraviolet or infrared spectral range. In particular, the active zone is arranged between the first semiconductor region and the second semiconductor region.

According to at least one embodiment, the semiconductor body is electrically contacted at the first surface by the first contact structure and at the second surface by the second contact structure. Further, the first contact structure at the second surface and the second contact structure at the first surface may be electrically insulated from the semiconductor body.

According to at least one embodiment, the first contact structure is arranged only outside the semiconductor body. In this case, the first contact structure may be in direct contact with surfaces of the semiconductor body, but does not penetrate into the semiconductor body. In particular, the first contact structure arranged outside the semiconductor body comprises at least one contact region extending from the first connection region to the second connection region. The first and second connection regions are thus electrically connected to each other by means of the at least one contact region. The at least one contact region may extend from the first connection region on the first surface, via at least one further surface, to the second connection region. For example, the contact region may completely or almost completely cover the at least one further surface. In particular, the contact region may form a mirror coating of the semiconductor body and comprise a reflective, such as metallic, material. Alternatively, the contact region may comprise a radiation-transmissive material, such as a transparent conductive oxide (TCO), such that the semiconductor body emits radiation at the at least one further surface.

Furthermore, in this embodiment, the second contact structure may be arranged partly inside the semiconductor body and comprise at least one contact region arranged in a recess of the semiconductor body. In this regard, the recess may penetrate the first and second semiconductor regions, the contact region arranged in the recess interconnecting the first and second connection regions of the second contact structure. The first and second connection regions are thus electrically connected to each other by means of the at least one contact region. The recess and, correspondingly, the contact region may be prism-shaped or cylindrical or may be frame-shaped or ring-shaped. The first and second connection regions of the second contact structure bound the contact region in the vertical direction.

In the case of a frame-shaped or ring-shaped design of the connection regions and the contact region of the second contact structure, a region of the semiconductor body enclosed by the latter can form a kind of "window" through which radiation can emerge from the semiconductor body.

According to at least one embodiment, both contact structures are arranged outside the semiconductor body. In particular, the contact structures each comprise at least one contact region that extends from the first connection region to the second connection region. As a result, the first and second connection regions are each electrically connected to each other.

In the embodiments described above, the second contact structure comprises a contact layer arranged directly on the second surface. Furthermore, the first connection region of the first contact structure is advantageously arranged directly on the first surface. By means of the first connection region, the first semiconductor region can be electrically contacted by the first contact structure at the first surface, while the second semiconductor region is electrically contacted by means of the contact layer by the second contact structure at the second surface.

According to at least one further embodiment, both contact structures are arranged partly inside the semiconductor body and each comprise a contact region arranged in a respective recess of the semiconductor body. Here, the contact region of the first contact structure may be arranged in a recess which extends through the second semiconductor region and ends in the first semiconductor region, while the contact region of the second contact structure is arranged in a recess which extends through the first semiconductor region and ends in the second semiconductor region. In particular, in this embodiment, the first and second connection regions of the first and second contact structures are each electrically insulated.

A radiation-emitting device is specified, comprising a semiconductor component of the type mentioned above and a carrier on which the semiconductor component is arranged. According to at least one embodiment, the carrier comprises a first contact pad electrically and mechanically connected to the first or second connection region of the first contact structure and a second contact pad electrically and mechanically connected to the first or second connection region of the second contact structure. The first and second contact pads may be reflective and may be provided for reflecting radiation emitted from the semiconductor body back towards the semiconductor body. In particular, the second contact pad is provided for reflecting the radiation exiting the "window" back towards the semiconductor body.

The semiconductor component may have a flat shape, particularly in the above embodiments. In particular, this means that a vertical extent of the semiconductor component is noticeably smaller than a lateral extent of the semiconductor component. For example, the semiconductor component may have a polyhedron shape, a cylinder shape or a semi-cylinder shape. In a non-limiting embodiment, the semiconductor component thus designed is a surface emitter, that is to say that it emits a major part of its radiation on only one side, which is arranged in particular parallel to a main extension plane of the semiconductor component. In this respect, the first and second surfaces may be arranged parallel to the main extension plane of the semiconductor component, with deviations of ±5° being tolerable. In a non-limiting embodiment, the main extension plane of the semiconductor component is spanned by a first lateral direction and a second lateral direction, wherein a vertical direction is perpendicular to the main extension plane. In particular, the vertical direction is parallel to a growth direction in which the semiconductor regions are successively grown.

Further, the semiconductor body may have at least one side surface connecting the first surface to the second surface and having a normal vector arranged parallel to the main extension plane of the semiconductor component. For example, the semiconductor body may be polyhedral, cylindrical or semi-cylindrical in shape. In one possible embodiment, the at least one side surface is free of connection regions.

According to at least one alternative embodiment, the semiconductor component has a three-dimensional, i.e. non-flat, shape. In particular, this means that a vertical extent of the semiconductor component is not noticeably different from a lateral extent of the semiconductor component. Advantageously, the semiconductor component has a polyhedron shape, for example a cuboid shape, prism shape or tetrahedron shape. Furthermore, the semiconductor component may have a semi-cylindrical shape. In this case, the semiconductor component is in particular a volume emitter, which means that the semiconductor component emits radiation with a not insignificant proportion on a plurality of sides. Advantageously, in this case the semiconductor body comprises a substrate which is transmissive for the generated radiation. In particular, the substrate comprises or consists of sapphire. In a non-limiting embodiment, in this embodiment, the first surface is arranged at a first main surface of the substrate, while the second surface is arranged at a second main surface of the substrate extending transversely to the first main surface. Alternatively, the second surface may be arranged at a second main surface of the substrate extending parallel to the first main surface.

In an advantageous embodiment of the semiconductor component, which is in particular three-dimensional, polyhedron-shaped or semi-cylindrical, the first contact structure is arranged only outside the semiconductor body. In a non-limiting embodiment, the second contact structure is arranged partly inside the semiconductor body and comprises at least one contact region which is arranged in a recess of the semiconductor body, the recess penetrating the first semiconductor region. The recess extends to the second semiconductor region, but does not penetrate the latter. A contact region of the second contact structure arranged in the recess connects the first connection region of the second contact structure to the second semiconductor region.

In a non-limiting embodiment of the three-dimensional semiconductor component, the latter comprises respectively one connection region of the first and second contact structures on each side. In this case, the connection regions of the first contact structure can be mechanically and electrically connected to one another, inter alia, in each case by a contact layer, and the connection regions of the second contact structure can be mechanically and electrically connected to one another, inter alia, in each case by a contact layer. In particular, the contact layer of the first contact structure is arranged downstream of the contact layer of the second contact structure, starting from the semiconductor body.

Advantageously, there is no exclusive mounting side for such a three-dimensional semiconductor component. Rather, the semiconductor component can advantageously be mounted and/or electrically connected on any side.

According to at least one embodiment, the first contact structure contains a metallic material. The second contact structure may also contain a metallic material. In a non-limiting embodiment, the connection regions of the first contact structure are formed from the same material. Likewise, the connection regions of the second contact structure may also be formed from the same material. In particular, the first and/or second contact structure(s) are formed, at least in regions, from a metal such as silver or copper or a metal compound. Further, the first and/or second contact structure(s) may be formed, at least in regions, from a transparent conductive oxide.

Materials based on nitride compound semiconductors are considered for the semiconductor regions or layers of the semiconductor body. "Based on nitride compound semiconductors" means in the present context that at least one layer of the semiconductor body comprises a nitride III/V compound semiconductor material, such as $Al_nGa_mIn_{1-n-m}N$, where $0 \leq n \leq 1$, $0 \leq m \leq 1$ and $n+m \leq 1$. However, this material need not necessarily have a mathematically exact composition according to the above formula. Rather, it may include one or more dopants as well as additional constituents that do not substantially alter the characteristic physical properties of the $Al_nGa_mIn_{1-n-m}N$ material. For the sake of simplicity, however, the above formula includes only the essential constituents of the crystal lattice (Al, Ga, In, N), even if these may be partially replaced by small amounts of other substances.

Optoelectronic semiconductor components of the type described here are particularly suitable for display devices such as displays or video walls. Here, it is important that the light-emitting diodes are well mixed in order to prevent, for example, shifts in the white point from becoming visible at bin boundaries. Advantageously, the optoelectronic semiconductor components described herein can be provided in bulk and thus well mixed without the need for alignment of the light-emitting diodes prior to assembly. Advantageously, the alignment step can be omitted since the semiconductor components do not have an exclusive mounting side.

The semiconductor components described here are also particularly suitable for providing light-emitting diodes in fluids in which the orientation of some of the light-emitting diodes is not maintained, because they can be mounted on different sides.

Further advantages, non-limiting embodiments and further developments of the optoelectronic semiconductor component and the radiation-emitting device will become apparent from the following explanations in conjunction with FIGS. 1 to 19.

BRIEF DESCRIPTION OF THE DRAWINGS

The accompanying drawings serve to provide an understanding of non-limiting embodiments. Further non-limiting embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1:
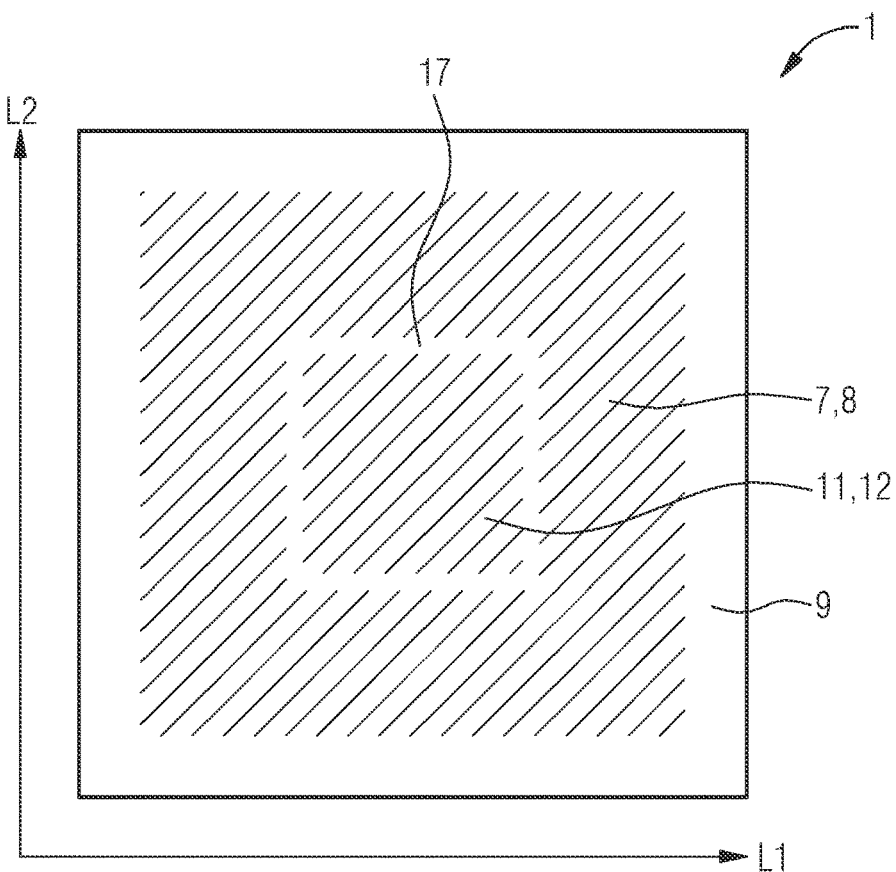
FIGS. 1 and 2 show schematic top views of a front and rear side of an optoelectronic semiconductor component according to first and second exemplary embodiments.
Figure 2:
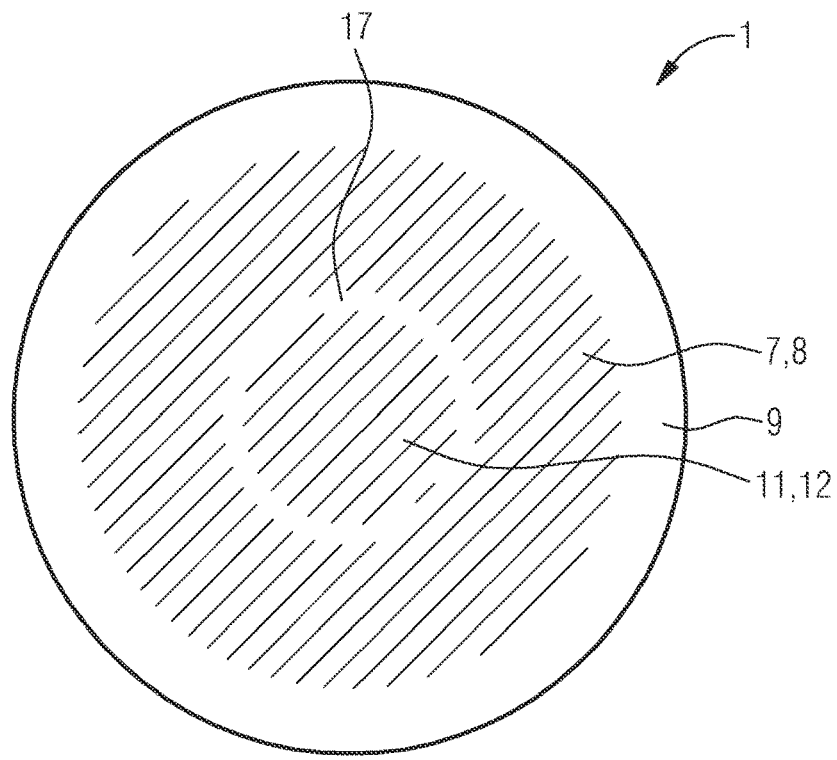
Figure 3:
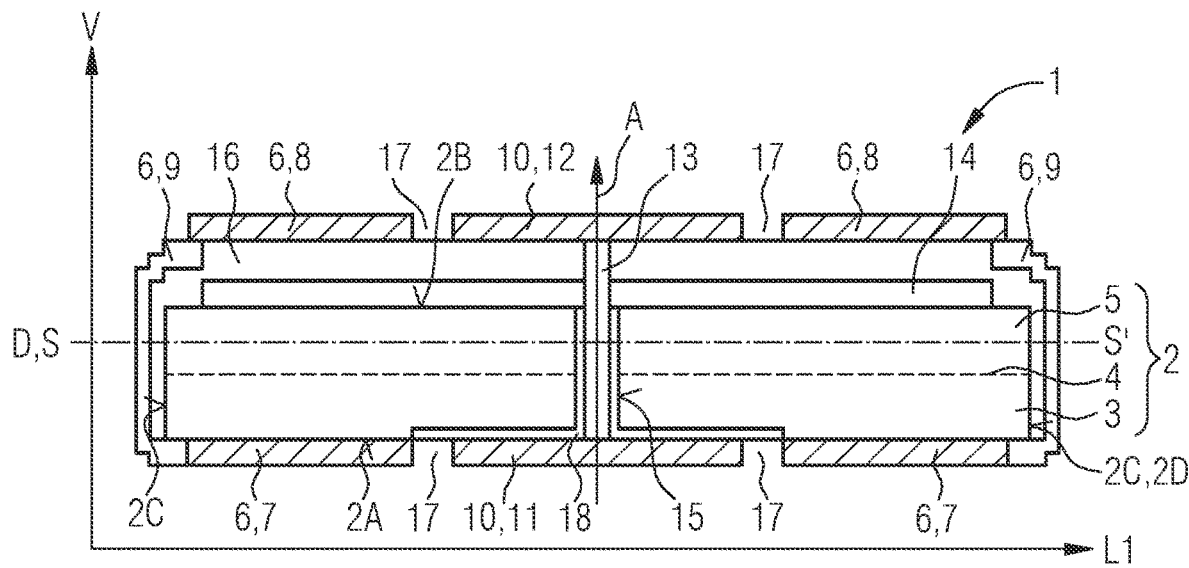
FIG. 3 shows a schematic cross-sectional view of the optoelectronic semiconductor component according to the first and second exemplary embodiments.

FIGS. 1 and 3 show a first exemplary embodiment of an optoelectronic semiconductor component 1, which is cuboidal in shape and has a flat shape, which means that a vertical extent of the semiconductor component 1 in a vertical direction V is noticeably smaller than a lateral extent of the semiconductor component 1 in a first and a second lateral direction L1, L2. Also, the second exemplary embodiment of an optoelectronic semiconductor component 1 shown in FIGS. 2 and 3 has a flat but cylindrical shape. This shape is particularly suitable for coupling out radiation also laterally.

The first lateral direction L1 and the second lateral direction L2 span a main extension plane, the vertical direction V being perpendicular to the main extension plane.

The following is applicable to both the semiconductor component 1 according to the first exemplary embodiment and according to the second exemplary embodiment.

The optoelectronic semiconductor component 1 comprises a semiconductor body 2 comprising a first semiconductor region 3 of a first conductivity type and a second semiconductor region 5 of a second conductivity type, and an active zone 4 arranged between the first and second semiconductor regions 3, 5. In particular, the first semiconductor region 3 is a p-type semiconductor region, while the second semiconductor region 5 is an n-type semiconductor region. Furthermore, the active zone 4 is a radiation-emitting zone which generates electromagnetic radiation during operation, for example in the visible, ultraviolet or infrared spectral range.

Further, the semiconductor body 2 comprises a first surface 2A and a second surface 2B different from the first surface 2A and arranged at a distance, parallel to the first surface 2A. In a non-limiting embodiment, the first surface 2A is a main surface of the semiconductor body 2 located near or at the first semiconductor region 3, while the second surface 2B is a main surface of the semiconductor body 2 located near or at the second semiconductor region 5.

The optoelectronic semiconductor component 1 comprises a first contact structure 6 for electrically contacting the first semiconductor region 3 and a second contact structure 10 for electrically contacting the second semiconductor region 5. The first and second contact structures 6, 10 each comprise a first connection region 7, 11 arranged on the first surface 2A and each comprise a second connection region 8, 12 arranged on the second surface 2B for electrically contacting the semiconductor component 1 from the outside. In order that the connection regions 7, 8, 11, 12 can be contacted from the outside, they are exposed or uncovered at least in places.

Furthermore, an intermediate space 17 is provided between the first connection regions 7, 11 of the two contact structures 6, 10, so that the first connection regions 7, 11 are electrically insulated from one another. This also applies accordingly to the second connection regions 8, 12 of the two contact structures 6, 10.

Furthermore, the first and second connection regions 7, 8 of the first contact structure 6 and the first and second connection regions 11, 12 of the second contact structure 10 are each designed to be rotationally symmetrical with respect to a symmetry axis D. Furthermore, the first and second connection regions 7, 8 of the first contact structure 6 and the first and second connection regions 11, 12 of the second contact structure 10 are each designed to be mirror-symmetrical with respect to a symmetry plane SS'. The symmetry axis D extends through the semiconductor component 1 in a plane arranged parallel to the main extension plane. Furthermore, the symmetry plane SS' is arranged parallel to the main extension plane and extends through the semiconductor component 1. A rotationally symmetrical or mirror-symmetrical design is to be understood not only as an identical design, but also as an equal design, that is to say having slight deviations in shape and/or size and/or position.

The first and second connection regions 7, 8 of the first contact structure 6 and the first and second connection regions 11, 12 of the second contact structure 10 each have a rotationally symmetrical shape. In particular, the connection regions have a rotationally symmetrical shape with respect to a symmetry axis A of the semiconductor body 2. The connection regions 7, 8 of the first contact structure 6 are frame-shaped with a rectangular contour (cf. FIG. 1) or a circular contour (cf. FIG. 2), while the connection regions 11, 12 of the second contact structure 10 have the shape of a rectangle (cf. FIG. 1) or a circle (cf. FIG. 2). The first connection region 11 of the second contact structure 10 is flanked on all sides or enclosed in a frame-like manner by the first connection region 7 of the first contact structure 6. Correspondingly, the second connection region 12 of the second contact structure 10 is flanked on all sides or enclosed in a frame-like manner by the second connection region 8 of the first contact structure 6. Thereby, the connection regions 7, 8 of the first contact structure 6 each form an outer contact on the respective surface 2A, 2B and the connection regions 11, 12 of the second contact structure 10 each form an inner contact on the respective surface 2A, 2B.

In the semiconductor component 1 according to the first and second exemplary embodiments, the first contact structure 6 is arranged only outside the semiconductor body 2. The first contact structure 6 comprises a contact region 9 extending from the first connection region 7 to the second connection region 8. The first and second connection regions 7, 8 are thus electrically connected to each other by means of the contact region 9. The contact region 9 may laterally completely envelop the semiconductor body 2 so that all side surfaces 2C, 2D are completely covered. Alternatively, at least two contact regions may be provided, for example in the form of strips, which respectively connect the first and second contact regions 7, 8 to one another and extend over different sides of the semiconductor body 2 (not shown). In a non-limiting embodiment, the first contact structure 6 comprises or consists of a metallic material such as silver and may thereby serve as a mirror coating.

Furthermore, the second contact structure 10 is arranged partly inside the semiconductor body 2 and comprises a contact region 13 arranged in a recess 15 of the semiconductor body 2. Here, the recess 15 penetrates the first and second semiconductor regions 3, 5, wherein the contact region 13 arranged in the recess 15 interconnects the first and second connection regions 11, 12 of the second contact structure 10 so that an electrical connection exists between the first and second connection regions 11, 12. The recess 15 and correspondingly the contact region 13 are for example prism or cylinder shaped. The first and second connection regions 11, 12 of the second contact structure 10 bound the contact region 13 in the vertical direction V. Furthermore, the second contact structure 10 comprises a contact layer 14 arranged directly on the second surface 2B and covers most of the latter.

The second contact structure 10 may comprise or consist of a radiation-transmissive material, such as a transparent conductive oxide (TCO), so that radiation can emerge from the semiconductor component 1 in the area of the second contact structure 10.

The semiconductor component 1 comprises a first insulation 16 arranged on the second surface 2B and located here between the contact layer 14 and the second contact regions 8, 12 of the two contact structures 6, 10. In addition, the first insulation 16 is arranged on the side surfaces 2C, 2D and is located here between the contact region 9 of the first contact structure 6 and the semiconductor body 2. The contact region 13 of the second contact structure 10 extends through the contact layer 14 and the first insulation 16 to the second connection region 11.

The semiconductor component 1 comprises a second insulation 18 arranged in the recess 15 and on the first surface 2A and located between the semiconductor body 2 and the contact region 13, and between the semiconductor body 2 and the first connection region 11 of the second contact structure 10.

By means of the first connection region 7, the first semiconductor region 3 is electrically contacted by the first contact structure 6 at the first surface 2A, while the second semiconductor region 5 is electrically contacted by means of the contact layer 14 by the second contact structure 10 at the second surface 2B.

The rotationally or mirror-symmetrical design of the connection regions 7, 8 and 11, 12 on the different surfaces 2A, 2B has the advantage that the optoelectronic semiconductor component 1 can be mounted and electrically connected without reorienting the semiconductor component 1 when the front side and the rear side are interchanged.

Figure 4:
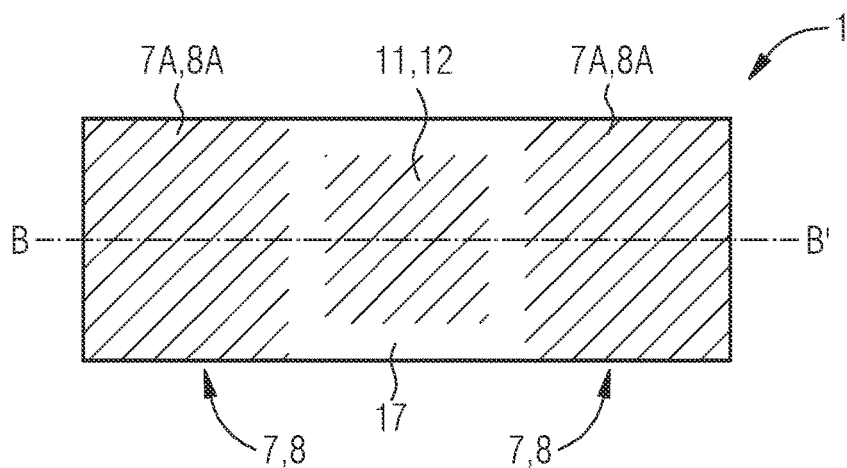
FIGS. 4 and 5 show a schematic top view and a schematic cross-sectional view, respectively, of an optoelectronic semiconductor component according to a third exemplary embodiment.
Figure 5:
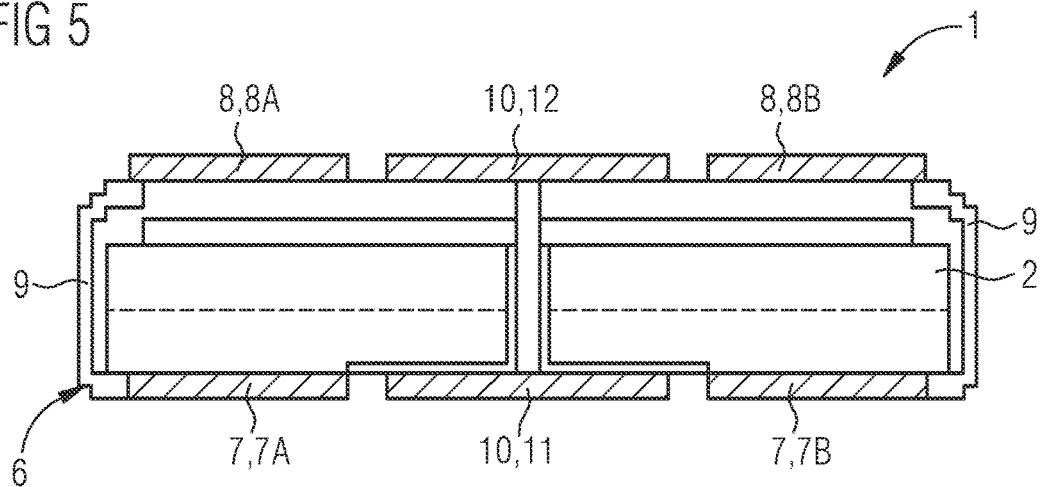

FIGS. 4 and 5 show a third exemplary embodiment of a semiconductor component 1, wherein FIG. 5 shows a cross-section along the sectional plane BB' shown in FIG. 4. The semiconductor components 1 according to the first, second and third exemplary embodiments are of similar design, and therefore the explanations given above also apply to the third exemplary embodiment.

However, there is a difference in the shape of the semiconductor component 1, which has a flat and elongated shape, where "elongated" means that the extension in one lateral direction is noticeably larger than in the other lateral direction. Another difference is in the first contact structure 6, the first and second connection regions 7, 8 of which each comprise two discontinuously formed sub-regions 7A, 7B and 8A, 8B. Such a contact structure 6 is particularly suitable for the elongated shape of the semiconductor component 1. The first connection region 11 of the second contact structure 10 is thereby delimited on two sides by the first connection region 7 of the first contact structure 10 or its sub-regions 7A, 7B. Accordingly, the second connection region 12 of the second contact structure 10 is delimited on two sides by the second connection region 8 of the first contact structure 6 or its sub-regions 8A, 8B. In particular, the intermediate space 17 extends from the first surface 2A over the side surfaces to the second surface 2B, so that the first contact structure 6 is discontinuous. Alternatively, the contact region 9 may be designed such that it interconnects the sub-regions 7A 7B and 8A, 8B.

Figure 6:
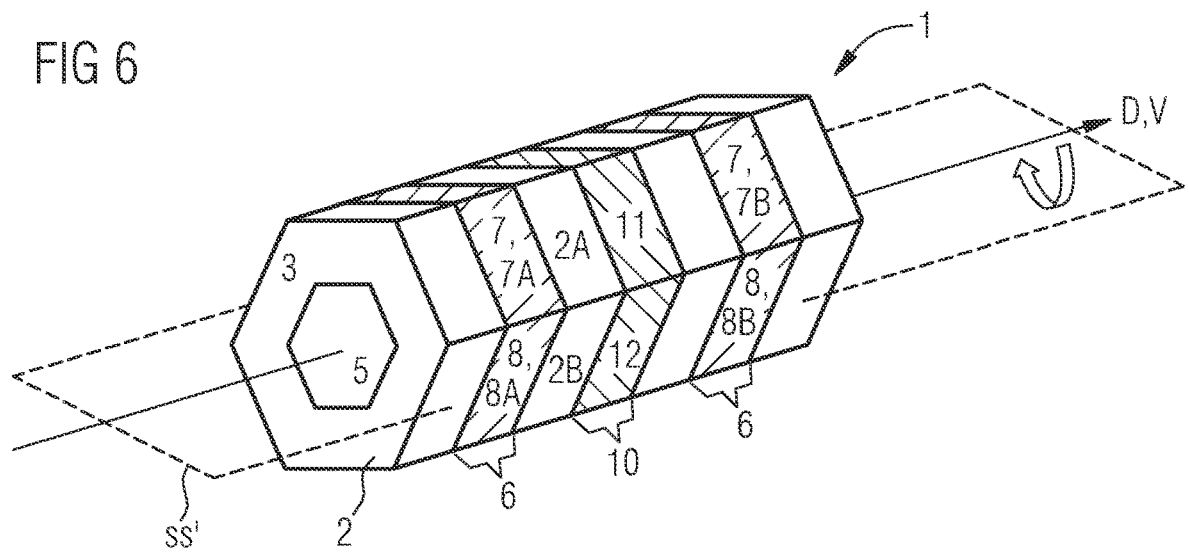
FIG. 6 shows a schematic three-dimensional illustration of an optoelectronic semiconductor component according to a fourth exemplary embodiment.

FIG. 6 shows a further, fourth exemplary embodiment of a semiconductor component 1, in which the first contact structure 6 is arranged only outside the semiconductor body 2, while the second contact structure 10 is arranged partly inside the semiconductor body 2 and comprises, in accordance with the first to third exemplary embodiments, a contact region arranged in a recess of the semiconductor body 2 (not shown). In this respect, the explanations given above also apply to the fourth exemplary embodiment.

In the fourth exemplary embodiment, the semiconductor component 1 has a three-dimensional prismatic shape. The second semiconductor region 5 is arranged within the first semiconductor region 3 and is surrounded by it in lateral directions. The semiconductor body 2 may be a so-called "nanorod".

In the fourth exemplary embodiment, both the first connection region 7 and the second connection region 8 of the first contact structure 6 each comprise two sub-regions 7A, 7B, 8A, 8B. Furthermore, in both the first contact structure 6 and the second contact structure 10, the first connection region 7, 11 directly adjoins the second connection region 8, 12. Both contact structures 6, 10 comprise further connection regions on further surfaces of the semiconductor body 2, which directly adjoin one another, so that the semiconductor body 2 is enveloped by the contact structures 6, 10 or their connection regions in a sleeve-like manner.

Figure 7:
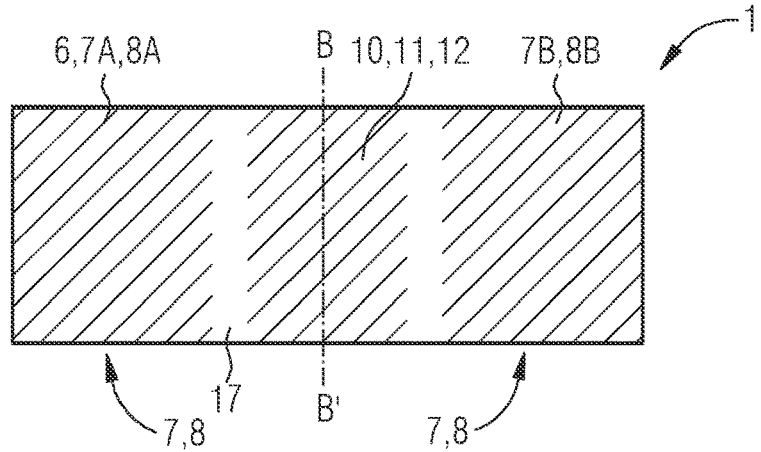
FIGS. 7 and 8 show a schematic top view and a schematic cross-sectional view along a sectional plane BB' of an optoelectronic semiconductor component according to a fifth exemplary embodiment.
Figure 8:
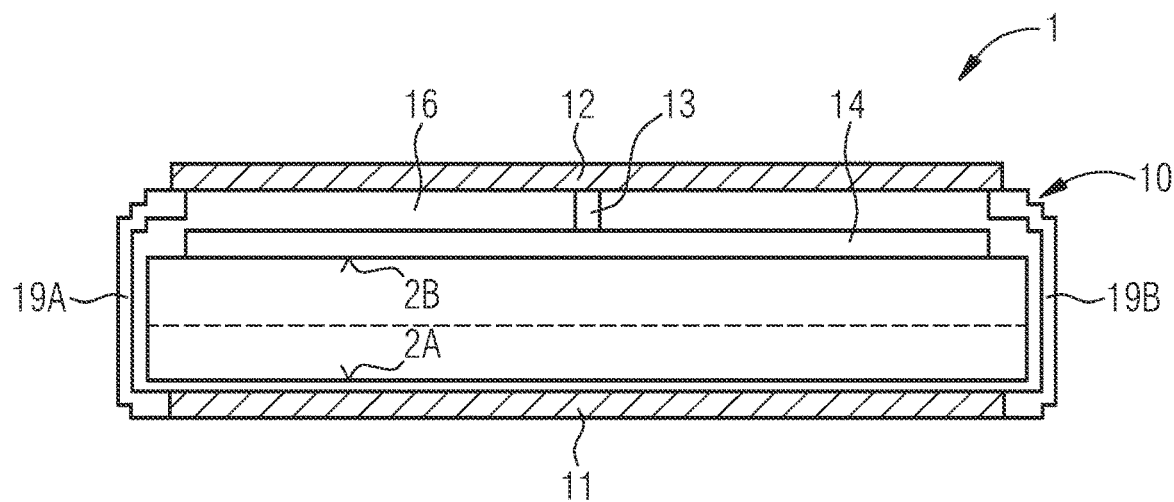

The semiconductor component 1 according to a fifth exemplary embodiment illustrated in FIGS. 7 and 8, like the semiconductor component 1 according to the third exemplary embodiment, has a flat elongated shape and a contact structure 6 having first and second connection regions 7, 8 comprising two sub-regions 7A, 7B and 8A, 8B, respectively.

The semiconductor components 1 according to the first to third and fifth exemplary embodiments are similar in design in principle, and therefore the explanations given above also apply to the fifth exemplary embodiment. However, in contrast to these exemplary embodiments, in the semiconductor component 1 according to the fifth exemplary embodiment, the second contact structure 10 is also arranged outside the semiconductor body 2. Here, the second contact structure 10 envelops the semiconductor body 2 in a sleeve-like manner. In this case, the second contact structure 10 comprises two contact regions 19A, 19B, each extending from the first connection region 11 to the second connection region 12. Furthermore, it comprises a contact region 13 and a contact layer 14, wherein the contact region 13 is arranged in a recess of an insulation 16 and extends from the contact layer 14 through the insulation 16 to the second connection region 12.

Figure 9:
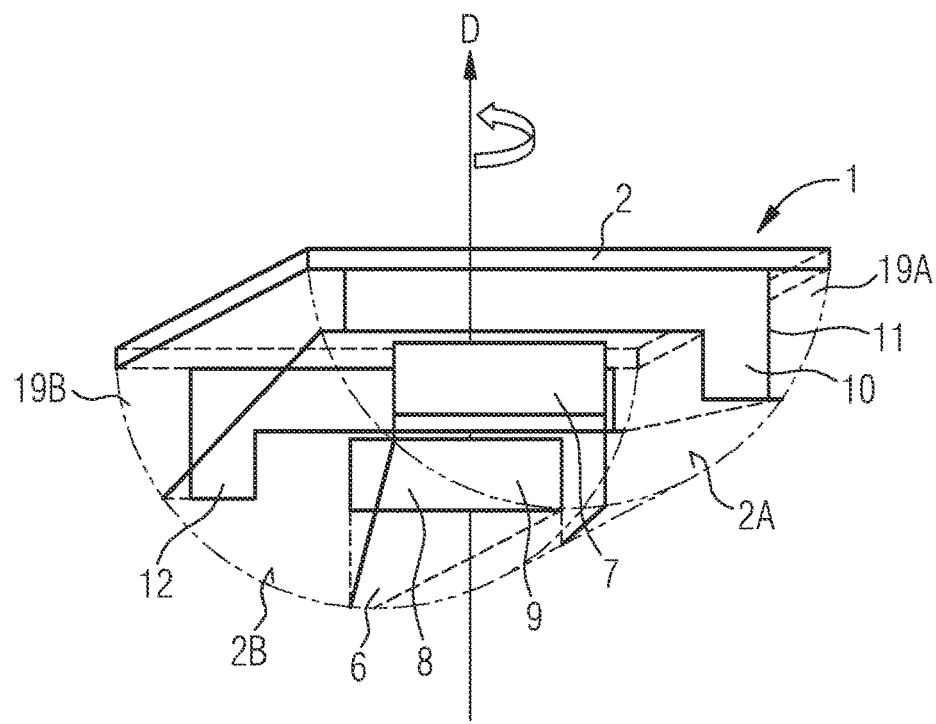
FIG. 9 shows a schematic three-dimensional illustration of an optoelectronic semiconductor component according to a sixth exemplary embodiment.

FIG. 9 shows a sixth exemplary embodiment of a semiconductor component 1, in which the first contact structure 6 and the second contact structure 10 are each arranged outside the semiconductor body 2 as in the fifth exemplary embodiment. Both contact structures 6, 10 comprise at least one contact region 9, 19A, 19B extending outside the semiconductor body 2 from the first connection region 7, 11 to the second connection region 8, 12, respectively.

The first and second connection regions 7, 8 of the first contact structure 6 and the first and second connection regions 11, 12 of the second contact structure 10 are each designed to be rotationally symmetrical with respect to the symmetry axis D. They are not mirror-symmetrical, but point-symmetrical.

The semiconductor component 1 according to the sixth exemplary embodiment has a three-dimensional, semi-cylindrical shape.

Figure 10:
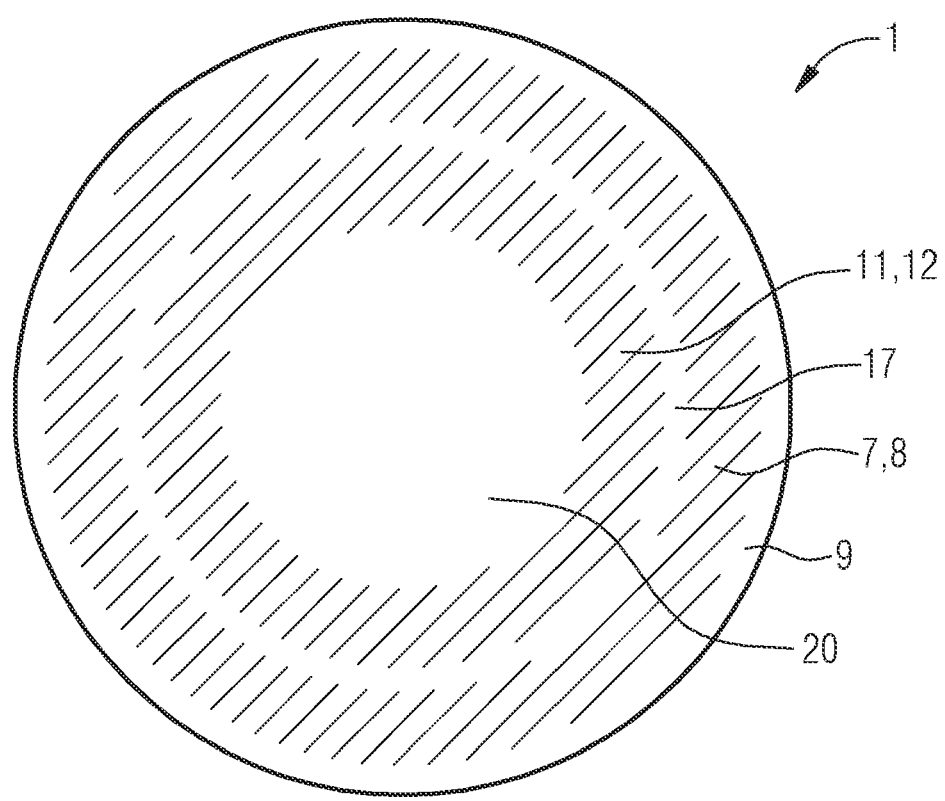
FIGS. 10 and 11 show a schematic top view and a schematic cross-sectional view of an optoelectronic semiconductor component according to a seventh exemplary embodiment, and a schematic cross-sectional view of a radiation-emitting device according to an exemplary embodiment.
Figure 11:
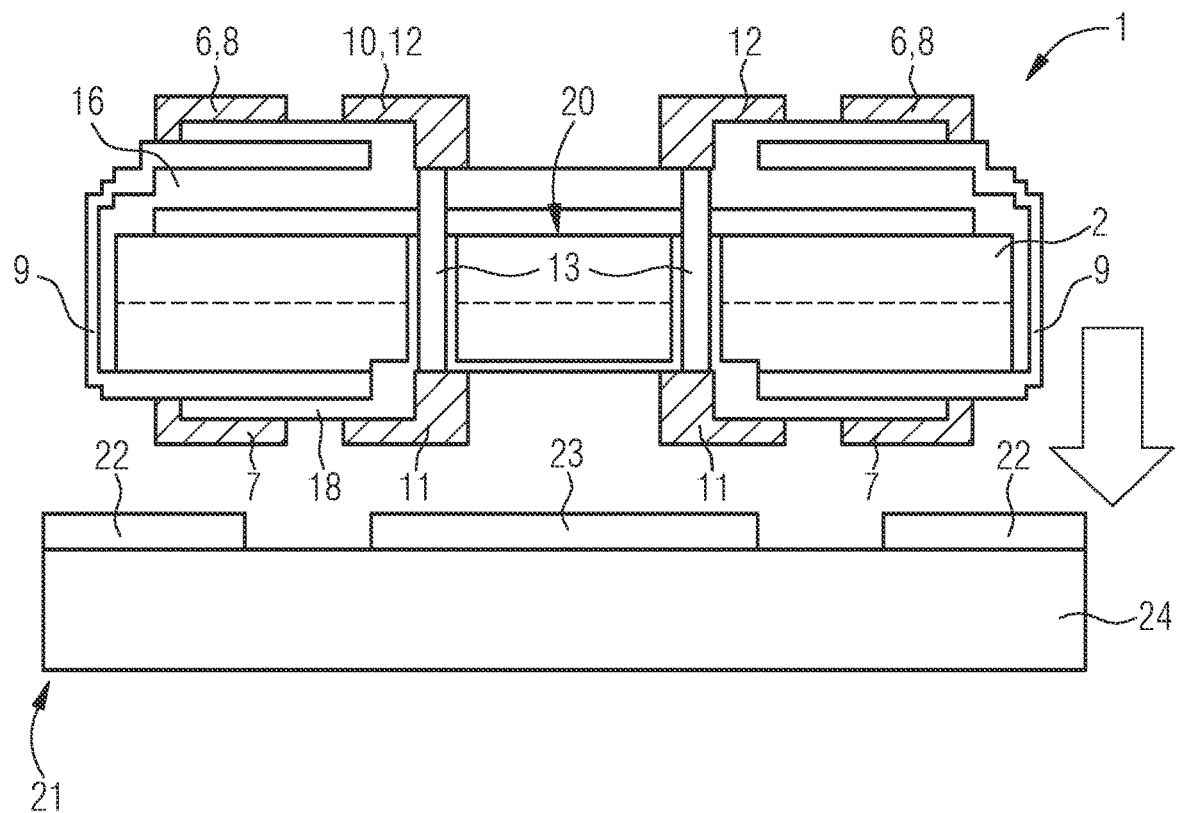

FIGS. 10 and 11 show a seventh exemplary embodiment of a semiconductor component 1 having a cylindrical shape, as according to the second exemplary embodiment. As in the first and second exemplary embodiments, the first and second connection regions 7, 8 of the first contact structure 6 are also frame-shaped. In contrast thereto, the first and second connection regions 11, 12 of the second contact structure 10 are also frame-shaped. In this case, the contact region 13 of the second contact structure 10 encloses an inner region 20 of the semiconductor body 2, the inner region 20 forming a kind of "window" through which radiation can emerge from the semiconductor body 2.

The semiconductor component 1 may be connected to a carrier 21, as indicated by an arrow (cf. FIG. 11), thereby forming a radiation-emitting device. The carrier 21 comprises a carrier body 24 and a first contact pad 22 and second contact pad 23 arranged on the carrier body 24, wherein the first contact pad 22 in the finished device is electrically and mechanically connected to the first or second connection region 7, 8 of the first contact structure 6, while the second contact pad 23 is electrically and mechanically connected to the first or second connection region 11, 12 of the second contact structure 10. Advantageously, the first and second contact pads 22, 23 are reflective and are configured to reflect radiation emerging from the inner region 20 back towards the semiconductor body 2.

Figure 12:
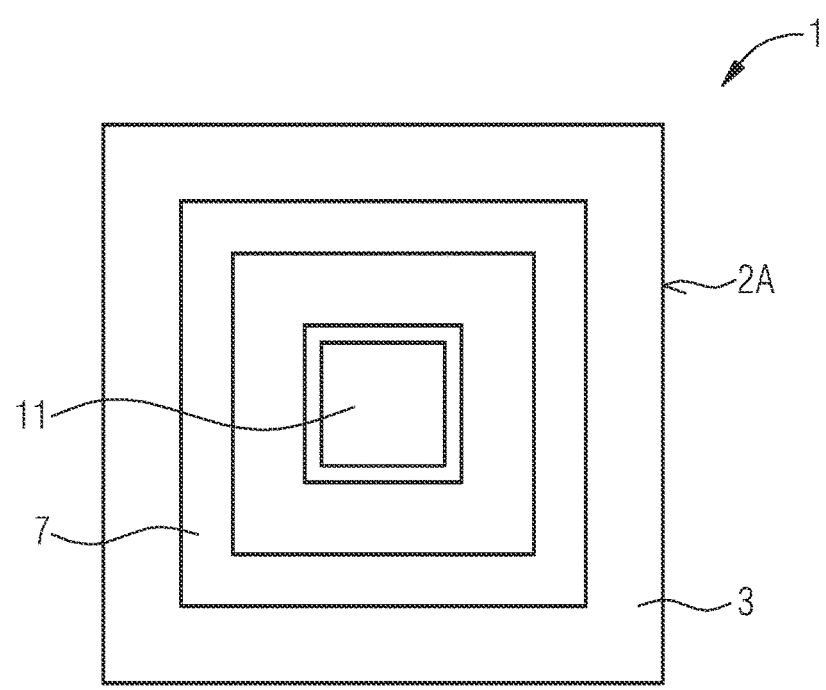
FIG. 12 shows a schematic top view of a front side and FIG. 13 shows a schematic top view of a rear side and FIG. 14 shows a schematic cross-sectional view of an optoelectronic semiconductor component according to an eighth exemplary embodiment.
Figure 13:
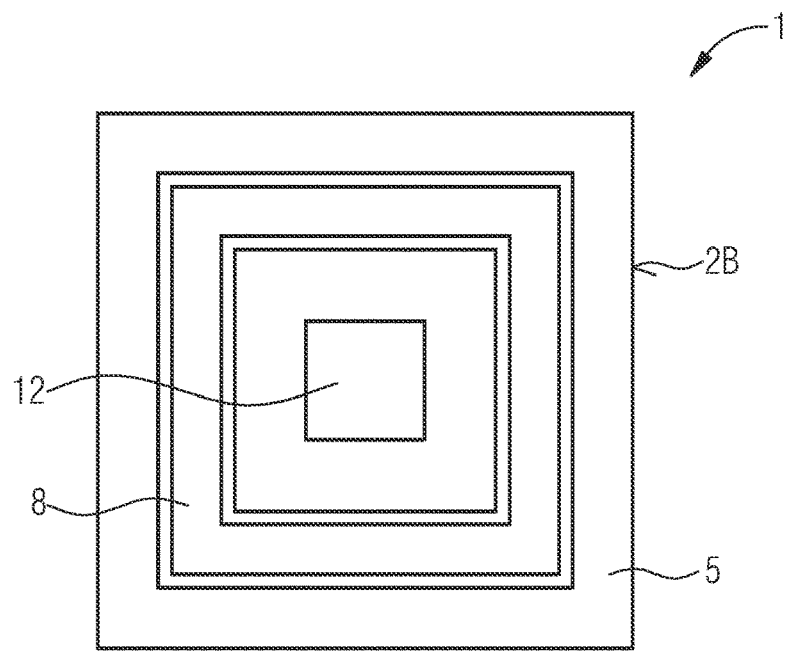
Figure 14:
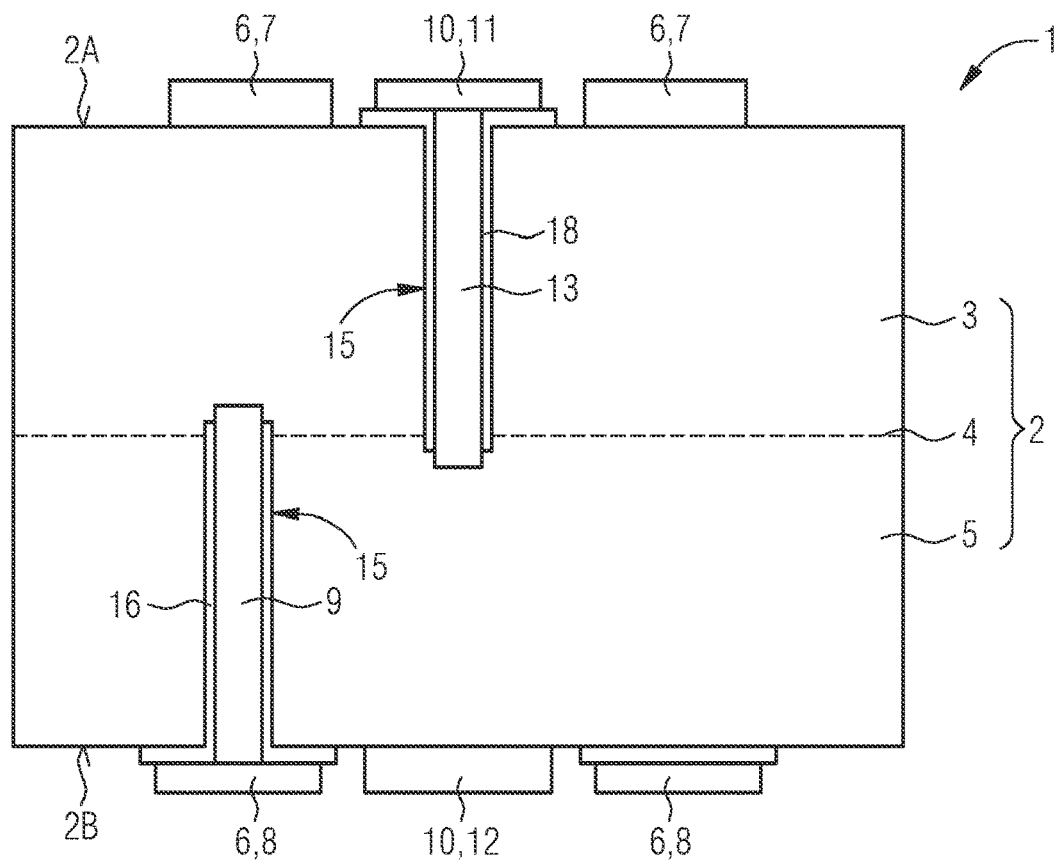

FIG. 12 shows a schematic top view of the first surface 2A, FIG. 13 a schematic top view of the second surface 2B and FIG. 14 a schematic cross-sectional view of an optoelectronic semiconductor component 1 according to an eighth exemplary embodiment. Here, both contact structures 6, 10 are arranged partly inside the semiconductor body 2 and each comprise a contact region 9, 13 arranged in a respective recess 15 of the semiconductor body 2. Here, the contact region 9 of the first contact structure 6 is arranged in a recess 15 which extends through the second semiconductor region 5 and ends in the first semiconductor region 3, while the contact region 13 of the second contact structure 10 is arranged in a recess 15 which extends through the first semiconductor region 3 and ends in the second semiconductor region 5.

The connection regions 11, 12 of the second contact structure 10 have a rectangular shape, while the connection regions 7, 8 of the first contact structure 6 are frame-shaped and laterally enclose the respective connection region 11, 12 of the second contact structure 10.

The first connection region 11 as well as the contact region 13 of the second contact structure 10 are electrically insulated from the first semiconductor region 3 by means of the second insulation 18, while the second connection region 12 is arranged directly on the second surface 2B. Furthermore, the second connection region 8 as well as the contact region 9 of the first contact structure 6 are electrically insulated from the second semiconductor region 5 by means of the first insulation 16, while the first connection region 7 is arranged directly on the first surface 2A.

By means of the first connection region 7, the first semiconductor region 3 can be electrically contacted by the first contact structure 6 at the first surface 2A, while the second semiconductor region 5 can be electrically contacted by means of the second connection region 12 by the second contact structure 10 at the second surface 2B.

Figure 15:
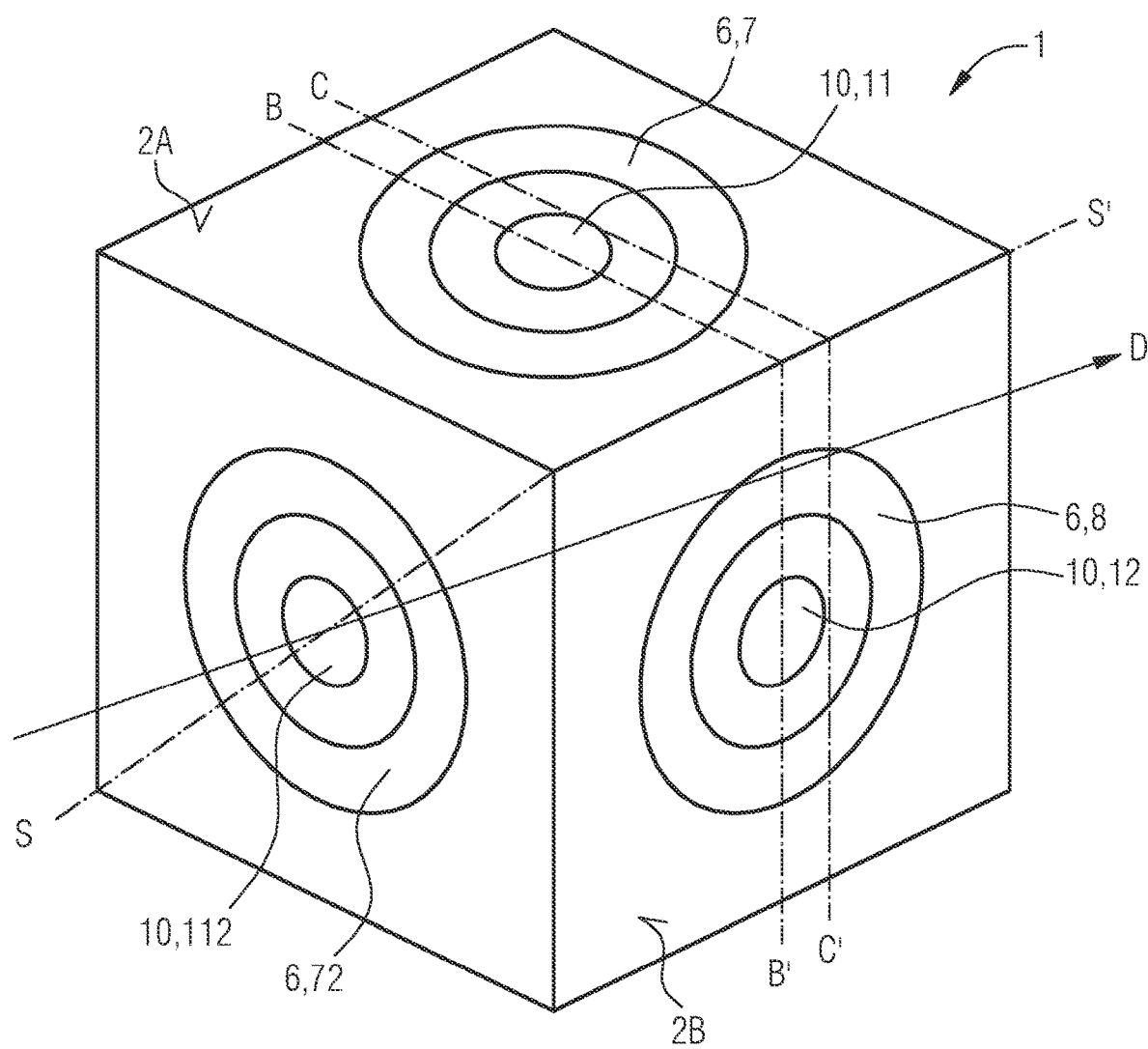
FIG. 15 shows a schematic three-dimensional illustration and FIGS. 16 and 17 show two different schematic cross-sectional views of an optoelectronic semiconductor component according to a ninth exemplary embodiment.
Figure 16:
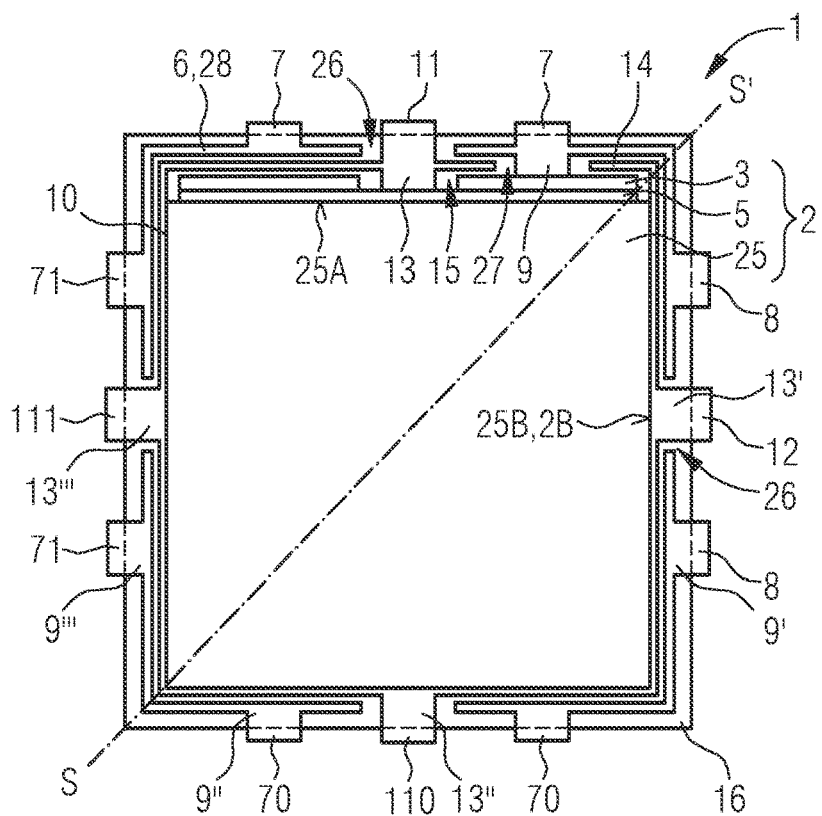
Figure 17:
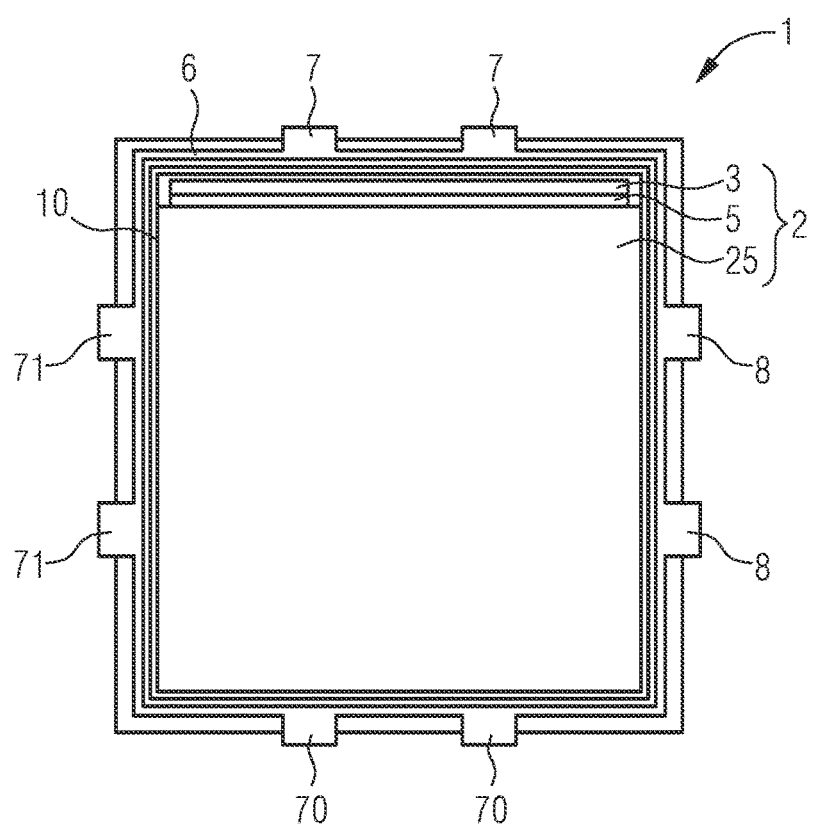

FIGS. 15 to 17 show a ninth exemplary embodiment of a semiconductor component 1, wherein FIG. 16 shows a cross-sectional view of the semiconductor component 1 along the cross-sectional plane BB' shown in FIG. 15, and FIG. 17 shows a cross-sectional view of the semiconductor component 1 along the cross-sectional plane CC' shown in FIG. 15. The semiconductor component 1 has a three-dimensional shape, a cube shape. In particular, the semiconductor component 1 is a volume emitter, which means that the semiconductor component 1 emits radiation with a not insignificant proportion on a plurality of sides.

Figure 18:
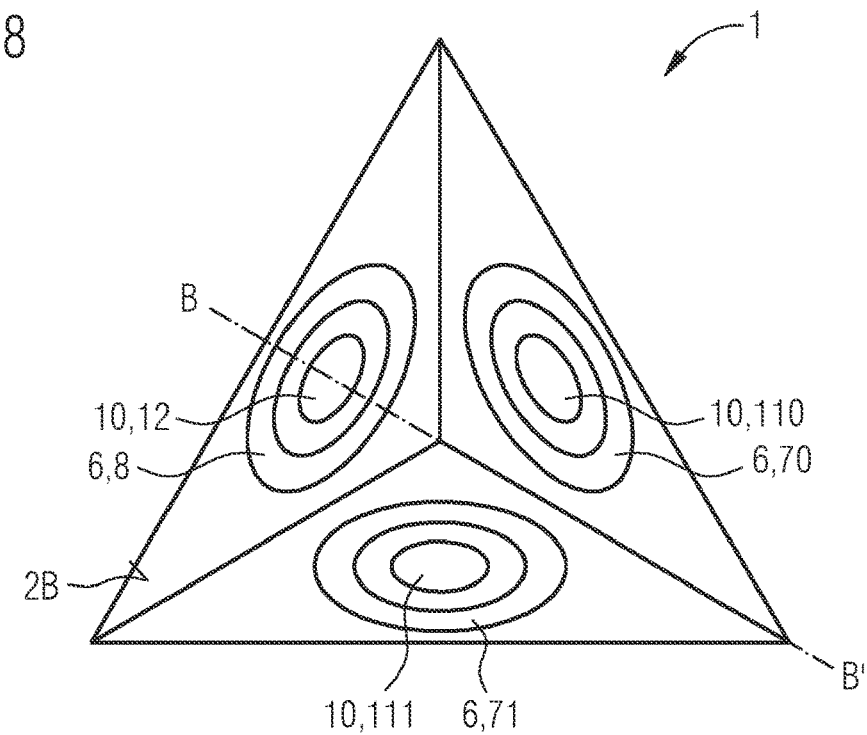
FIGS. 18 and 19 show a schematic top view and a schematic cross-sectional view, respectively, of an optoelectronic semiconductor component according to a tenth exemplary embodiment.
Figure 19:
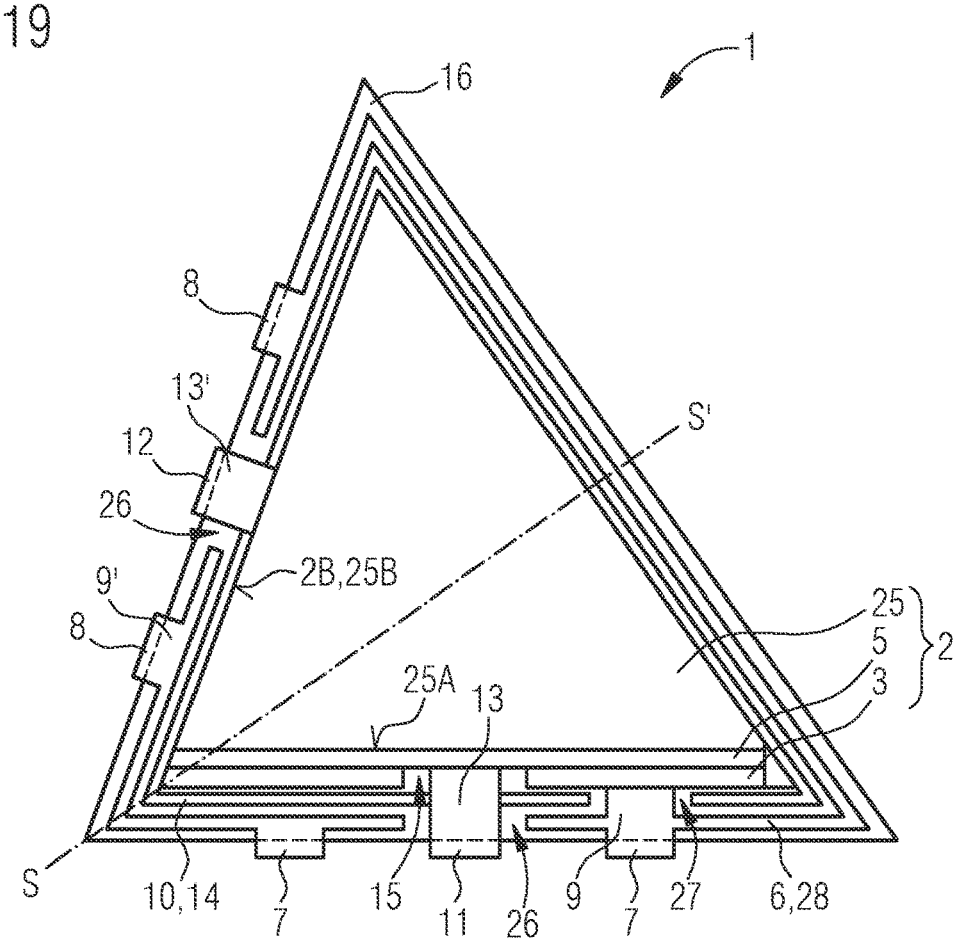

Also, the semiconductor component 1 according to a tenth exemplary embodiment shown in FIGS. 18 and 19 is in particular a volume emitter. FIG. 19 shows a cross-sectional view of the semiconductor component 1 along the cross-sectional plane BB' shown in FIG. 18. The semiconductor component 1 has a tetrahedral shape and is otherwise designed like the semiconductor component 1 according to the ninth exemplary embodiment. Furthermore, the exemplary embodiments illustrated in FIGS. 6 and 9 may also be designed like the semiconductor component 1 according to the ninth exemplary embodiment. Therefore, the following explanations apply to the semiconductor component 1 according to the ninth exemplary embodiment as well as according to the fourth, sixth, and tenth exemplary embodiments.

The semiconductor body 2 of the semiconductor component 1 comprises a substrate 25 on which the first and second semiconductor regions 3, 5 are arranged, wherein the first, in particular p-type semiconductor region 3 is arranged downstream of the second, in particular n-type semiconductor region 5, starting from the substrate 25. In a non-limiting embodiment, the substrate 25 comprises or consists of sapphire and is thus in particular transmissive for blue radiation. According to the ninth exemplary embodiment, the substrate 25 is cube-shaped, while according to the tenth exemplary embodiment it is tetrahedron-shaped.

The first surface 2A is arranged on a first main surface 25A of the substrate 25, while the second surface 2B is arranged on a second main surface 25B of the substrate 25 extending transversely to the first main surface 25A. The first and second semiconductor regions 3, 5 are arranged on the first main surface 25A of the substrate 25.

The semiconductor component 1 comprises a first contact structure 6 for electrically contacting the first semiconductor region 3 and a second contact structure 10 for electrically contacting the second semiconductor region 5, the first and second contact structures 6, 10 each comprising a first connection region 7, 11 arranged on the first surface 2A and each comprising a second connection region 8, 12 arranged on the second surface 2B for electrically contacting the semiconductor component 1 from the outside, wherein the first and second connection regions 7, 8 of the first contact structure 6 and the first and second connection regions 11, 12 of the second contact structure 10 are each designed to be rotationally symmetrical with respect to a symmetry axis D and mirror-symmetrical with respect to a symmetry plane SS'. The connection regions 7, 8 of the first contact structure 6 are circular in shape, while the connection regions 11, 12 of the second contact structure 10 have the shape of a circle. In this case, the symmetry plane SS' extends transversely to a main extension plane of the semiconductor component 1 arranged parallel to the first main surface 25A. In particular, the connection regions 11, 12 of the second contact structure 10 form an inner contact, while the connection regions 7, 8 of the first contact structure 6 form an outer contact.

The semiconductor component 1 comprises respectively one connection region of the first and second contact structures 6, 10 on each side, the connection regions 7, 8, 70, 71, 72 of the first contact structure 6 being mechanically and electrically connected to one another, inter alia, in each case by a contact layer 28, and the connection regions 11, 12, 110, 111, 112 of the second contact structure 10 being connected to one another, inter alia, in each case by a contact layer 14. The contact layer 28 of the first contact structure 6 is arranged downstream of the contact layer 14 of the second contact structure 10, starting from the semiconductor body 2.

The semiconductor component 1 comprises an insulation 16 in which the semiconductor body 2 and the first and second contact structures 6, 10 are embedded, the insulation 16 being arranged between the two contact layers 14, 28.

The semiconductor component 1 comprises a recess 15 penetrating the first semiconductor region 3. The recess 15 extends to the second semiconductor region 5, but does not penetrate it. A contact region 13 of the second contact structure 10 arranged in the recess 15 connects the first connection region 11 of the second contact structure 10 to the second semiconductor region 5. The contact region 13 extends through an interruption 26 in the contact layer 28 of the first contact structure 6 to the first connection region 11 of the second contact structure 10.

Furthermore, the first contact structure 6 comprises a contact region 9 which extends through an interruption 27 in the contact layer 14 of the second contact structure 10 and connects the first connection region 7 of the first contact structure 6 to the first semiconductor region 3. Here, the first contact structure 6 is arranged only outside the semiconductor body 2. Furthermore, the two contact structures 6, 10 comprise contact regions 9', 9'', 9''', 13', 13'', 13''' on the second surface 2B and each further surface, respectively, which connect the connection regions 7, 8, 70, 71, 72, 12, 110, 111, 112 to the contact layers 14, 28. Here, the contact regions 12, 110, 111, 112 of the second contact structure 10 extend through interruptions 26 of the first contact structure 6.

Advantageously, the semiconductor component 1 according to the ninth and tenth exemplary embodiments does not have an exclusive mounting side. Rather, the semiconductor component 1 can be mounted and/or electrically connected on any side.

The invention is not limited by the description based on the exemplary embodiments. Rather, the invention encompasses any new feature as well as any combination of features, which in particular includes any combination of features in the patent claims, even if this feature or combination itself is not explicitly stated in the patent claims or exemplary embodiments.

LIST OF REFERENCE SIGNS 1 optoelectronic semiconductor component
2 semiconductor body
2A first surface
2B second surface
2C, 2D side surface
3 first semiconductor region
4 active zone
5 second semiconductor region
6 first contact structure
7 first connection region of the first contact structure
7A, 7B sub-region of the first connection region
8 second connection region of the first contact structure
8A, 8B sub-region of the second connection region
9, 9', 9'', 9''' contact region of the first contact structure
10 second contact structure
11 first connection region of the second contact structure
12 second connection region of the second contact structure
13, 13', 13'', 13''', 19A, 19B contact region of the second contact structure
14 contact layer of the second contact structure
15 recess
16 (first) insulation
17 intermediate space
18 second insulation
20 inner region
21 carrier
22 first contact pad
23 second contact pad
24 carrier body
25 substrate
25A first main surface of the substrate
25B second main surface of the substrate
26, 27 interruption
28 contact layer of the first contact structure
70, 71, 72 further connection regions of the first contact structure
110, 111, 112 further connection regions of the second contact structure
A, D symmetry axis
BB' sectional plane
CC' sectional plane
SS' symmetry plane
L1 first lateral direction
L2 second lateral direction
V vertical direction

The invention claimed is:
1. An optoelectronic semiconductor component comprising:
a semiconductor body comprising:
a first semiconductor region of a first conductivity type;
a second semiconductor region of a second conductivity type;
a first surface; and
a second surface different from the first surface;
a first contact structure for electrically contacting the first semiconductor region and a second contact structure for electrically contacting the second semiconductor region, the first and second contact structures each comprising a first connection region arranged on the first surface and each comprising a second connection region arranged on the second surface for electrically contacting the semiconductor component from the outside;

wherein the first connection region of the first contact structure and the second connection region of the first contact structure are each designed to be rotationally symmetrical in relation to one another with respect to an axis of symmetry;

wherein the first connection region of the second contact structure and the second connection region of the second contact structure are each designed to be rotationally symmetrical in relation to one another with respect to the axis of symmetry; and wherein both contact structures are arranged outside the semiconductor body and each comprise at least one contact region extending from the first connection region to the second connection region.

2. The optoelectronic semiconductor component according to claim 1, wherein the first and second connection regions of the first contact structure and the first and second connection regions of the second contact structure are each designed to be mirror-symmetrical with respect to a plane of symmetry.

3. The optoelectronic semiconductor component according to claim 1, wherein the first and second connection regions of the first and second-contact structures and the first and second connection regions of the second contact structure each have a rotationally symmetrical arrangement with respect to a second axis of symmetry, the second axis of symmetry is perpendicular to the first surface and the second surface and extends through the semiconductor body.

4. The optoelectronic semiconductor component according to claim 1, wherein the semiconductor body is electrically contacted at the first surface by the first contact structure and at the second surface by the second contact structure.

5. The optoelectronic semiconductor component according to claim 1, wherein the first connection region of the second contact structure is flanked by the first connection region of the first contact structure and the second connection region of the second contact structure is flanked by the second connection region of the first contact structure.

6. The optoelectronic semiconductor component according to claim 1, the at least one contact region of the second contact structure comprises two contact regions, each extending from the first connection region to the second connection region of the second contact structure outside the semiconductor body, and the second contact structure further comprises a contact connecting region and a contact layer, wherein the contact connecting region is arranged in a recess of an insulation disposed between the second connection region and the contact layer and extends from the contact layer through the insulation to the second connection region.

7. The optoelectronic semiconductor component according to claim 1, wherein both contact structures are arranged only outside the semiconductor body.

8. The optoelectronic semiconductor component according to claim 1, wherein the at least one contact region extends from the first connection region to the second connection region outside the semiconductor body.

9. The optoelectronic semiconductor component according to claim 1, wherein the axis of symmetry is parallel to the first surface and the second surface and extends through the semiconductor body.

10. The optoelectronic semiconductor component according to claim 1, wherein the optoelectronic semiconductor component has a flat and elongated shape, where an extension of the optoelectronic semiconductor component in a first lateral direction is larger than an extension of the optoelectronic semiconductor component in a second lateral direction perpendicular to the first lateral direction, the first and second lateral directions spanning a main extension plane.

11. The optoelectronic semiconductor component according to claim 1, wherein the first semiconductor layer and the second semiconductor layer are coextensive in the semiconductor body.

12. The optoelectronic semiconductor component according to claim 1, wherein the first surface is a main surface of the semiconductor body disposed near or at the first semiconductor region and the second surface is a main surface of the semiconductor body disposed near or at the second semiconductor region.

13. The optoelectronic semiconductor component according to claim 1, wherein the second contact structure surrounds the semiconductor body in a sleeve-like manner.

14. The optoelectronic semiconductor component according to claim 1, wherein the first connection region of the first contact structure comprises a first sub-region and a second sub-region; wherein the second connection region of the first contact structure comprises a first sub-region and a second sub-region.

15. The optoelectronic semiconductor component according to claim 14, wherein the first connection region of the second contact structure is disposed between the first and second sub-regions of the first connection region of the first contact structure and the second connection region of the second contact structure is disposed between the first and second sub-regions of the second connection region of the first contact structure.

16. The optoelectronic semiconductor component according to claim 1, having a flat shape, wherein the first and second surfaces are arranged parallel to a main extension plane of the semiconductor component.

* * * * *